United States Patent [19]

Yamada et al.

[11] Patent Number: 5,040,041
[45] Date of Patent: Aug. 13, 1991

[54] SEMICONDUCTOR DEVICE AND SIGNAL PROCESSING DEVICE HAVING SAID DEVICE PROVIDED THEREIN

[75] Inventors: Katsuhiko Yamada; Shigetoshi Sugawa, both of Atsugi; Hidemasa Mizutani, Sagamihara, all of Japan

[73] Assignee: Canon Kabushiki Kaisha, Tokyo, Japan

[21] Appl. No.: 422,773

[22] Filed: Oct. 17, 1989

[30] Foreign Application Priority Data

Oct. 20, 1988 [JP] Japan .................. 63-262929

[51] Int. Cl.⁵ .................................................. H01L 27/14
[52] U.S. Cl. ................................ 357/30; 357/24; 357/32; 250/578.1
[58] Field of Search ............... 357/30 P, 30 H, 30 G, 357/30 K, 30 S, 32, 4, 24 LR; 307/561, 562; 250/578

[56] References Cited

U.S. PATENT DOCUMENTS

| | | | |
|---|---|---|---|
| 4,279,000 | 7/1981 | Fukada et al. .................. 358/213 |
| 4,376,888 | 3/1983 | Fukuda et al. .................. 250/211 J |
| 4,541,015 | 9/1985 | Itoh et al. ........................ 357/30 H X |
| 4,650,984 | 3/1987 | Furushima et al. ............... 250/211 |
| 4,675,887 | 6/1987 | Akiyama et al. ............. 357/30 H X |
| 4,694,316 | 9/1987 | Chabbal ......................... 357/30 H X |
| 4,742,239 | 5/1988 | Nakagawa et al. ............... 250/578 |
| 4,751,559 | 6/1988 | Sugawa et al. .................... 357/30 |
| 4,763,007 | 8/1988 | Takahashi .................... 357/30 H X |
| 4,829,485 | 5/1989 | Hatanka et al. ..................... 365/239 |
| 4,847,668 | 7/1989 | Sugawa et al. ..................... 357/30 |
| 4,886,962 | 12/1989 | Gofuku et al. ..................... 250/211 |

FOREIGN PATENT DOCUMENTS 0244081 11/1987 European Pat. Off. .
62-73629 4/1987 Japan .
62-73630 4/1987 Japan .

Primary Examiner—William Mintel
Attorney, Agent, or Firm—Fitzpatrick, Cella, Harper & Scinto

[57] ABSTRACT

A semiconductor device is provided with plural charge accumulation type sensor elements, each of the sensor elements having an active semiconductor region. Plural charge transferring elements transfer charge signals which are stored in the sensor elements, each of the charge transferring elements corresponding to a respective one of the sensor elements. A common conductive member is provided with an insulating member to be capacitively coupled with the sensor elements. An operating member produces a drive signal to drive the charge transferring elements and detects the voltage signal on the common conductive member. The charge transferring elements are controlled on the basis of a voltage signal corresponding to the respective voltages accumulated in the sensor elements in accordance with a voltage of the common conductive member.

23 Claims, 9 Drawing Sheets 5,040,041

SEMICONDUCTOR DEVICE AND SIGNAL PROCESSING DEVICE HAVING SAID DEVICE PROVIDED THEREIN

BACKGROUND OF THE INVENTION

1. Field of the Invention

This invention relates to a semiconductor device to be used in a facsimile, a camera, a scanner device for image reading, etc., particularly to a semiconductor device which determines the next accumulation time based on the signals of the signal charges accumulated at a predetermined accumulation time read from a plural number of charge accumulation type sensor elements.

2. Related Background Art

In the prior art, a sensor device of the charge accumulation type has a constitution as shown below.

FIG. 1 is a schematic diagram showing the constitution of the charge accumulation type sensor device.

As shown in the same Figure, a plural number (n) of sensor cells $S_1$-$S_n$ are respectively connected to electrical switching circuits $SW_1$-$SW_2$ for reading the signals by said sensor cells. The respective switching circuits $SW_1$-$SW_n$ are electrically connected to a shift register SR and are successively scanned by said shift register SR. The signals accumulated in the respective sensor cells are successively then processed by an amplifier AM to be outputted from output terminal OUT. The output from the amplifier AM is subjected to peak detection and average value arithmetic operation in the arithmetic operation circuit C for determining the accumulation time in the sensor cell for the next time and the output signal of circuit C is feedback to the shift register SR. The accumulation time greatly influences the sensitivity and the S/N ratio, thus the accumulation time can be determined on the basis of the signal read from the sensor cell.

FIG. 2 is a schematic diagram for illustration of the signal read cycle of the photosensor of the above charge accumulation type.

As shown in the same Figure, the signal read cycle for one time requires, in addition to the accumulation time ($t_n$) and the read time ($t_r$), the arithmetic operation time ($t_c$) for calculating the accumulation time for the next time ($t_{n+1}$), and further requires a one cycle idle time which is not finally outputted for calculating the accumulation time of the first time ($t_{n-1}+t_r+t_c$).

However, the arithmetic operation time ($t_c$) and the idle time as mentioned above are difficult for high speed actuation, additionally the arithmetic operation circuit is complicated. Therefore it is desired to have the signal processing device lower in cost having high reliability.

SUMMARY OF THE INVENTION

The present invention has been accomplished in view of the technical task as described above, and its object is to provide a semiconductor device and a signal processing device of high performance and high reliability at low cost.

Another object of the present invention is to provide an excellent semiconductor device which can be sufficiently adapted having an improved signal processing speed in which the semiconductor device is mounted, while additionally simplifying the feedback circuit provided.

Still another object of the present invention is to provide a semiconductor device and a signal processing device having an electroconductive layer capacitively coupled commonly to the respective charge accumulation type sensor sections provided in plural number through an insulating layer.

Still another object of the present invention is to provide a semiconductor device and a signal processing device which can perform an arithmetic operation of the optimum accumulation time during the accumulation actuation by outputting the average value of the voltages accumulated in the respective sensor cells during accumulation actuation of the signals in the sensor cells to enhance the processing speed.

DESCRIPTION OF THE PREFERRED EMBODIMENTS

Figure 1:
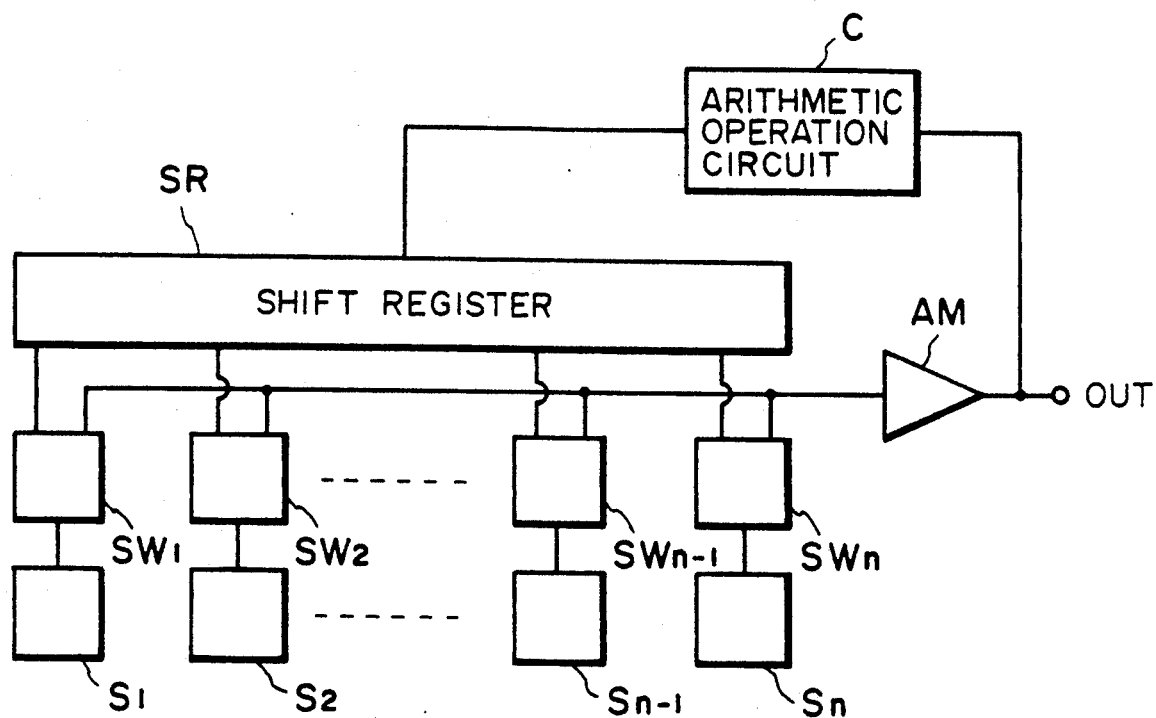
FIG. 1 is a schematic block diagram illustrating the reading method of the photoelectric converting device of the prior art.
Figure 2:
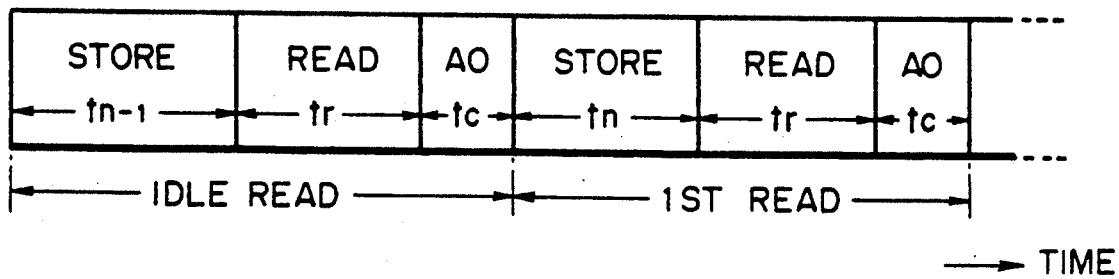
FIG. 2 is a schematic diagram illustrating the reading method and the time required for reading of the photoelectric converting device of the prior art.

Referring now to the drawings, the embodiments of the present invention are described. It is noted that the present invention should not be limited to these embodiments, but includes also any constitution which can accomplish the object of the present invention may be employed.

One preferred embodiment of the present invention is a semiconductor device as described above, comprising a structure having an electroconductive layer provided between an insulating layer and a plurality of charge accumulating sections, the respective charge accumulating sections and the electroconductive layer being capacitively coupled commonly.

When the semiconductor device is made of a charge accumulation type sensor section, if the signals accumulated begin to be read from the respective accumulation type sensor elements, the voltage accumulate ($V_j$) is transmitted through capacitance ($C_X$) to the electroconductive layer. If the floating capacitance of the electroconductive layer and the ground potential is made ($C_Y$), the voltage of the electroconductive layer ($V_X$) becomes:

$$V_X = \sum_{j=1\sim n} V_j \frac{C_X}{nC_X + C_Y}$$

($V_1$-$V_n$: sensor output voltages).

Here, since the relationship of $C_X >> C_Y$ is generally valid, the above formula becomes:

$$V_X = \frac{\sum_{j=1\sim n} V_j}{n}$$

and this indicates that the voltage $V_X$ becomes the average value of the voltage accumulated of the respective sensors.

More specifically, in the semiconductor device, since the voltage $V_X$ of the above electroconductive layer is outputted always during accumulation actuation of charges in the charge accumulation type sensor element, it becomes possible to perform arithmetic operation of the optimum accumulation time during the accumulation actuation.

The structure for accomplishing the objects of the present invention is a semiconductor device having a plurality of charge accumulation type sensor elements and electroconductive members capacitively coupled commonly through insulating members to each of said plurality of sensor elements. The semiconductor device outputs a signal voltage corresponding to the average value of the respective voltages accumulated in said plurality of sensor elements. A signal processing device comprises:

a semiconductor device having a plurality of charge accumulation type sensor elements and electroconductive members capacitively coupled commonly through insulating members to each of said plurality of sensor elements;

A driving means is provided for reading the signal from said sensor element,

A reading means reading the output signal from said electroconductive members,

The output signal outputted from said electroconductive members feedback to said driving means.

These semiconductor device, driving means, reading means, etc. may have, for example, (A) a structure in which they are integrally prepared on a single crystalline substrate, or (B) the respective means may be formed on separate substrates, arranged on one support and electrically connected to each other. Alternatively, (C) these may be provided respectively on separate supports and connected to each other.

These configurations may be suitably selected, and for example, when the semiconductor device has a single crystal semiconductor substrate, the above structure (A) is preferable for miniaturization, and in the case of one having a photoelectric converting section on an insulating substrate such as an equal size type lengthy sensor, the above structure (B) is preferable.

Figure 3:
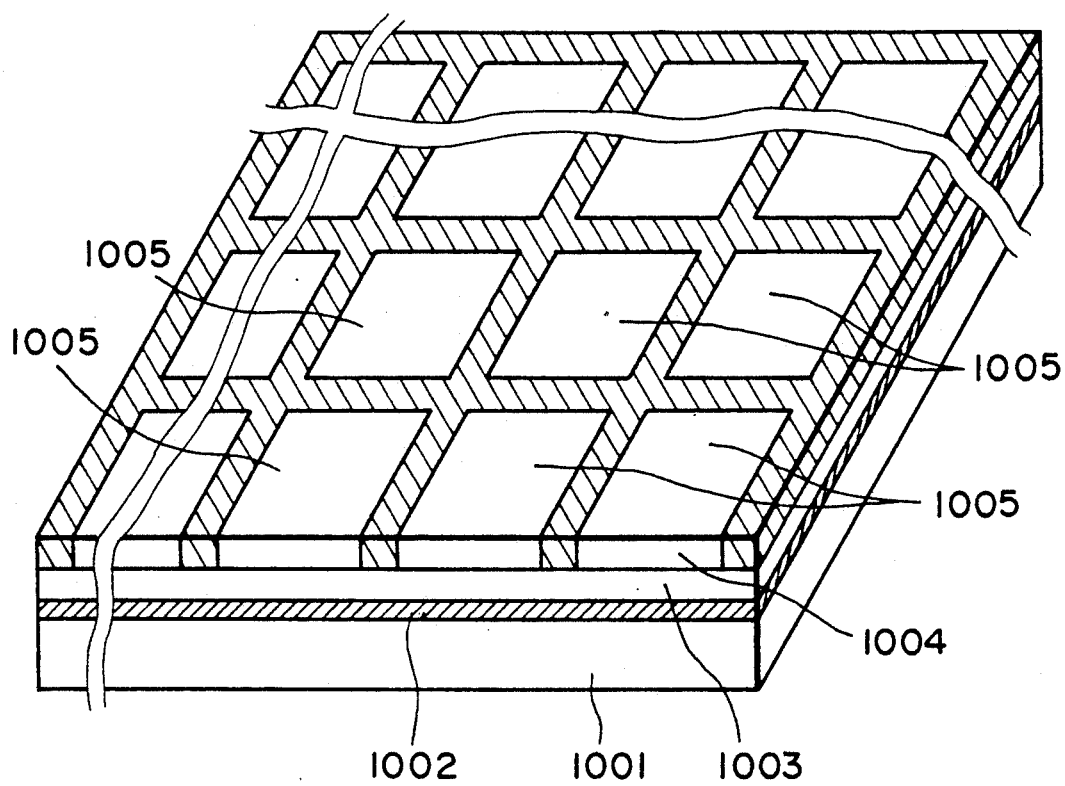
FIG. 3 is a schematic diagram showing an example of the area sensor according to the present invention.

As preferred embodiments of the present invention, there may be included line sensor, area sensor, etc. FIG. 3 shows a schematic perspective view showing the above photosensor device. Element 1001 denotes a substrate having at least an insulating surface, which may be an insulating substrate itself such as glass, alumina, sapphire, and other various ceramics, or one having an insulating layer such as $Si_xO_y$ or $Si_xN_y$ formed on a semiconductor substrate such as silicon single crystal, etc. Furthermore, there may be employed a substrate made of metal having an insulating layer on the surface, for example, a metal plate of Al having an insulating layer such as $Al_2O_3$, etc. formed thereon.

Element 1002 denotes an electroconductive layer, comprising a metal material such as Al, Cr, Ni, Cu, Au, Ag, Pt, W, etc. or an oxide such as $SnO_2$, ITO, etc. formed by vapor deposition or the sputtering method.

Element 1003 denotes an insulating layer, comprising silicon oxide ($Si_xO_y$), silicon nitride ($Si_xN_y$), silicon oxide nitride ($Si_xO_yN_z$) formed by the sputtering method or the CVD method. Of course, PSG film, BSG film or BPSG film doped with P (phosphorus) or B (boron) may be used.

Element 1004 denotes a semiconductor layer comprising an active region.

In the semiconductor layer 1004, photosensitive photoelectric converting sections or switch elements, etc. are formed as the charge accumulation type sensor element. Accordingly, the semiconductor layer, for example, may be selected from such materials as Si, Ge, Se, SiGe, SiC, GaAs, etc. Its structural state is not limited to single crystal, but may be suitably selected from polycrystalline, amorphous (including microcrystalline structure) structures. Also, its layer construction constitution is not limited to a single layer, but a multi-layer constitution or a ultra-lattice constitution may be employed.

As a particularly preferable structure, there may be employed single crystalline silicon or non-single crystalline silicon such as polycrystalline, amorphous silicon, etc., amorphous silicon carbide (hereinafter called a-SiC), amorphous selenium (a-Se) or a superlattice structure of a-Si and a-$Si_xN_y$.

The sensor cell 1005 thus formed is arranged in a X-Y matrix to form an area sensor device.

Also, for formation of the semiconductor layer 1004 as described above, all film formation methods can be used. Particularly, when a single crystalline material is used for making a semiconductor device with high mobility of carriers, it is preferable to use a single crystal formed according to the crystal formation method proposed by the present Applicant (Assignee) (see published European Patent Application No. 0.244.081). Of course, it is possible to use one formed into a single crystal by recrystallization by the laser annealing method, etc. well known in the art.

The reason why particularly the former is preferable is that a single crystal can be directly formed according to the gas phase growth method such as the CVD method, etc. More specifically, as the surface on which a single crystal is to be formed, a nucleation surface and a non-nucleation surface with different nucleation densities are formed. At this time, the nucleation surface is made fine so as to form only a nucleus to be grown into a single crystal. When gas phase growth is permitted to proceed on such surface by setting suitably conditions of desired gas species, pressure, temperature, a single crystal based on said nucleation surface can be obtained.

As a representative material constituting the non-nucleation surface, $SiO_2$ may be employed, and as the material constituting the nucleation surface, $Si_3N_4$, etc. may be employed.

As the structure of the photoelectric converting section, a photovoltaic type or a photoconductive type having a charge accumulation section may be employed. Of course, a photovoltaic type having added a charge accumulation section may be also employed.

FIRST EXAMPLE

The example shown below is one in which the present invention is used for the line type photosensor.

FIGS. 4A-4D are schematic cross-sectional views showing the preparation steps of the line type photosensor using the present invention.

Figure 4A:
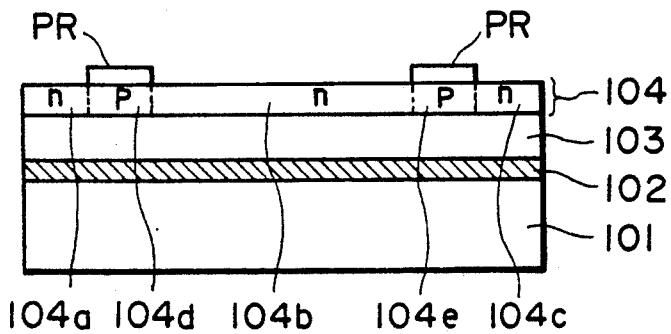
FIGS. 4A to 4D are schematic cross-sectional views illustrating the method for producing the photosensor cell according to the present invention.

First, as shown in FIG. 4A, on a $SiO_2$ substrate 101 was deposited on Al layer 102 as the electroconductive layer having a thickness of 1 μm produced by the sputtering method.

Furthermore, an $Si_3N_4$ layer 103 was formed on Al layer 102 as the silicon nitride film according to the low pressure CVD method (LPCVD) to form an insulating layer with a thickness of 1 μm.

On the $Si_3N_4$ layer 103 is formed a poly-Si with large particle sizes of 1.0 μm or more as the semiconductor layer 104, and the poly-Si with large particle sizes of 1.0 μm or more should be preferably prepared by use of the formation method of a polycrystalline film proposed by the present Applicant in Japanese Patent Applications Nos. 62-73629 and 62-73630. Accordingly, as the deposition conditions of the semiconductor layer 104, by use of $SiH_2Cl_2$ as the source gas, $H_2$ as the carrier gas, HCl as the etching gas and $B_2H_6$ as the doping gas, p+ type semiconductor layer was formed as the semiconductor layer 104 according to the above-mentioned method.

Further, on a desired region on the semiconductor 104 was formed a photoresist PR, which was subjected to patterning, and P was diffused according to the thermal diffusion method into the region not covered with the photoresist to form n-type semiconductor regions 104a, 104b, 104c. In this way, the semiconductor regions 104d, and 104a which should constitute the photosensor element and the semiconductor regions 104b, 104e and 104c which should constitute the signal processing circuit section could be formed in the lateral direction.

Figure 4B:
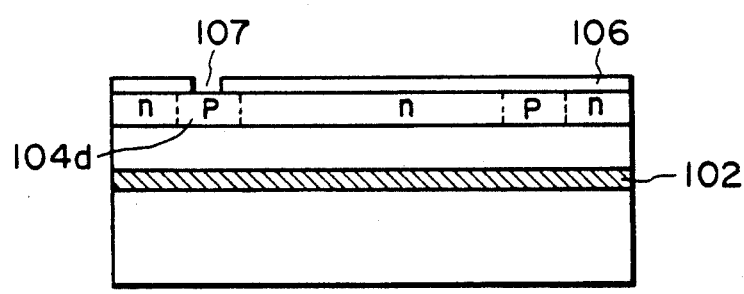

Next, as shown in FIG. 4B, an insulating film 106 comprising $SiO_2$ was formed by use of the CVD method, and a contact hole 107 was formed at a desired position on the above p-type semiconductor region 104d.

Figure 4C:
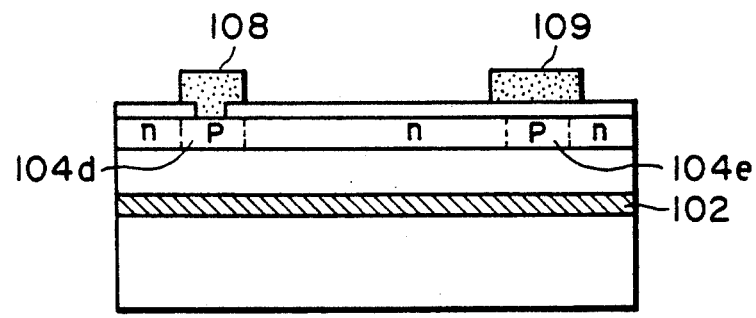

Next, as shown in FIG. 4C, low resistance polycrystalline silicons 108, 109 doped at high concentrations with the p-type impurity were formed according to the CVD method on the p-type semiconductor regions 104d, 104e. The polycrystalline silicon on the semiconductor region 104e becomes the gate electrode for the MOS transistor which forms the processing circuit.

Figure 4D:
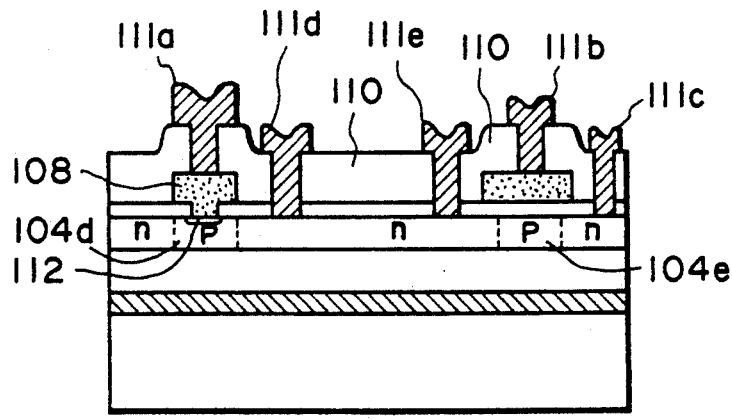

Next, as shown in FIG. 4D, a $SiO_2$ layer 110 as the interlayer insulating layer was deposited according to the CVD method on the whole surface, a contact hole was formed on a desired region and Al was deposited by the sputtering method, followed by etching to form Al electrodes 111a-111e. By the heat treatment during this process, the p-type impurity was diffused into the semiconductor region 104d from the above polycrystalline silicon 108 to form a very thin semiconductor layer 112, whereby ohmic contact between the polycrystalline silicon 108 and the semiconductor region 104d was rendered possible.

In the following, the line type photosensor device with the above constitution is described in more detail.

Figure 5:
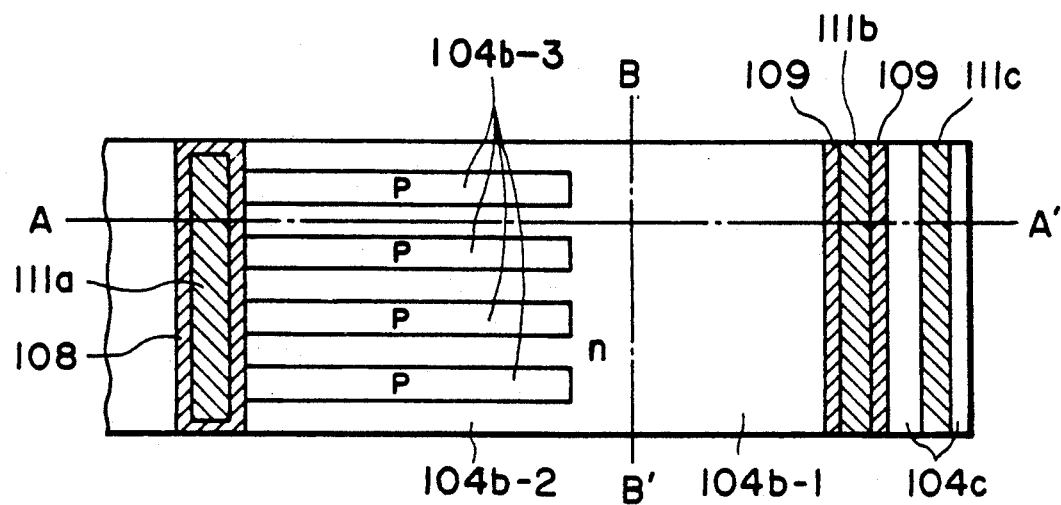
FIG. 5 is a schematic top view showing an example of the photosensor cell according to the present invention.

FIG. 5 is a schematic plan view of one cell of the photosensor device by use of the present invention.

Figure 6:
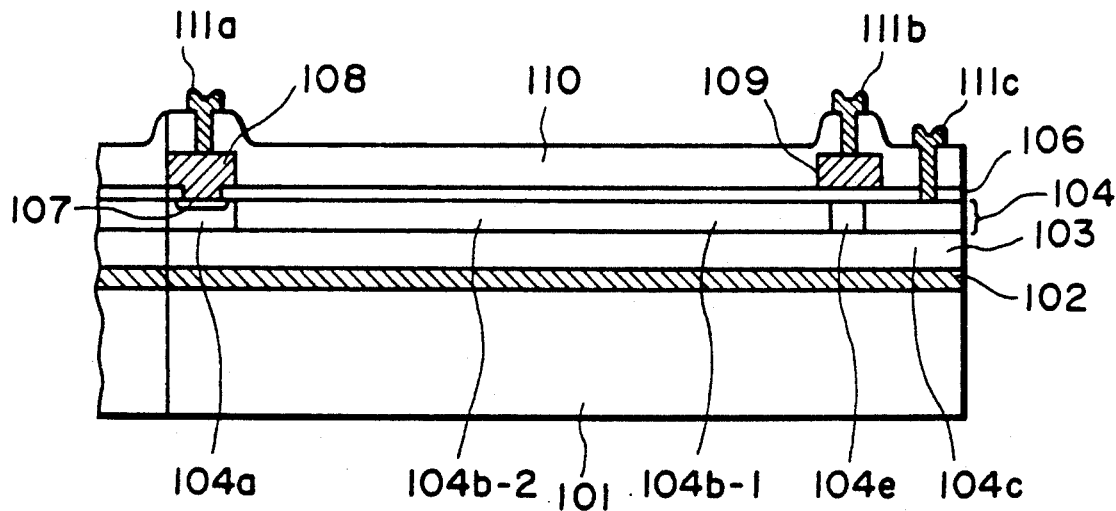
FIG. 6 is a schematic cross-sectional view taken along the line A—A' in FIG. 5.
Figure 7:
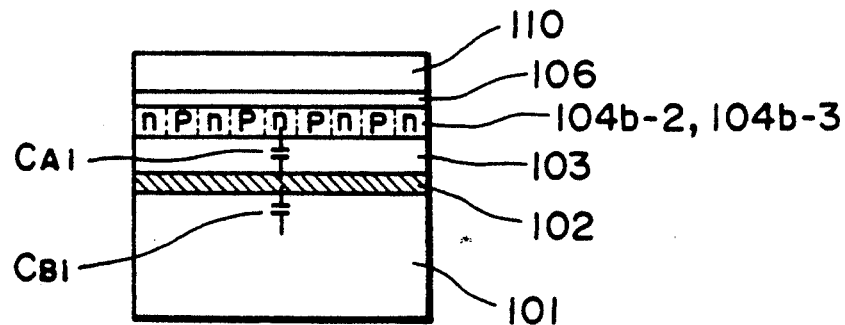
FIG. 7 is a schematic cross-sectional view taken along the line B—B' in FIG. 5.

FIG. 6 is a schematic longitudinal cross-sectional view along the line A—A' of one cell of the photosensor device shown in FIG. 5, and FIG. 7 is a schematic cross-sectional view along the line B—B' for illustration of the structure according to the present invention of the photosensor device shown in FIG. 5.

Figure 8:
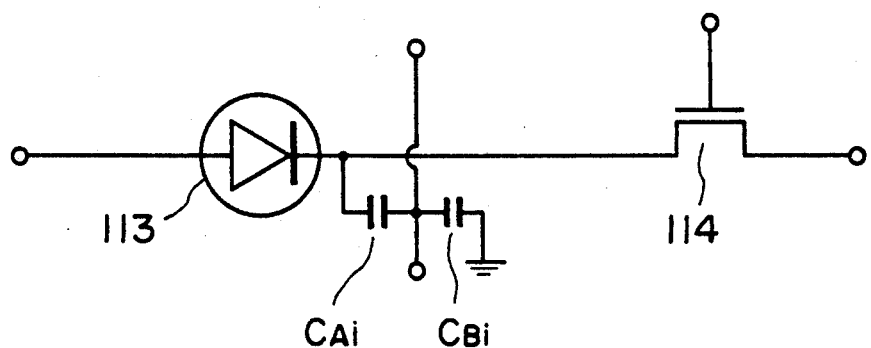
FIG. 8 is the equivalent circuit diagram of the photosensor cell according to the present invention.

FIG. 8 is an equivalent circuit of one cell of the above photosensor.

As shown in FIGS. 5, 6 and 7, on an insulating layer 103 provided through an intermediary electroconductive layer 102 on a substrate 101 is formed a sensor cell having a light-receiving section and a switching element section.

As the light-receiving section, has a photodiode including a PN junction portion between 104a and 104b-3 which are the p-type semiconductor regions and the 104b-2 which is the n-type semiconductor region.

As the switching element section including an MOS transistor having a source region 104b-1, which is the n-type semiconductor region, a channel region 104e comprising the p-type semiconductor and a drain region 104c comprising the n-type semiconductor.

The PN junction of the photodiode, as shown in FIG. 5, has a "comb" shape formed by arrangement of a plurality of strips of the p-type semiconductor regions 104b-3 as the anode region, whereby the carriers formed by light can be easily integrated.

Also, the n-type semiconductor region 104b-2 as the cathode region and the n-type semiconductor region 104b-1, as the source region of the MOS transistor, are the common semiconductor layer region.

Element 111a is an anode electrode wiring which is electrically connected through an anode electrode 108 comprising a polysilicon to the anode region 104a of the semiconductor layer 104, 111b is a gate electrode wiring which is electrically connected to the gate electrode 109 of the MOS transistor comprising a polysilicon, and 111c is a drain electrode wiring which is electrically connected to the drain region 104c.

Light incident on the unit element with such a configuration will generate carriers, and the carriers generated are accumulated by PN junction as electrons and positive holes. The carriers (electrons) accumulated apply signals on the gate electrode to change the potential of the channel region 104e and move electrons from the source region to the drain region, which are read as the electrical signals.

In the sensor device of this Example, as shown in FIG. 7, The semiconductor layer 104 and the Al layer 102 form a parasitic capacitance $C_{Ai}$ with the $Si_3N_4$ layer 103 sandwiched therebetween, and further a floating capacitance $C_{Bi}$ is formed between the Al layer 102 and the earth.

This is represented equivalently by the equivalent circuit diagram as shown in FIG. 8.

In FIG. 8, 113 denotes a diode as the photosensor, the cathode side of which diode 113 is connected to the MOS transistor 114, and also grounded through the parasitic capacitance $C_{Ai}$ and the floating capacitance $C_{Bi}$.

The photosensor device is constituted by juxtaposing a plurality of the cell portions as shown in FIG. 5 in an array with intervals.

Figure 9:
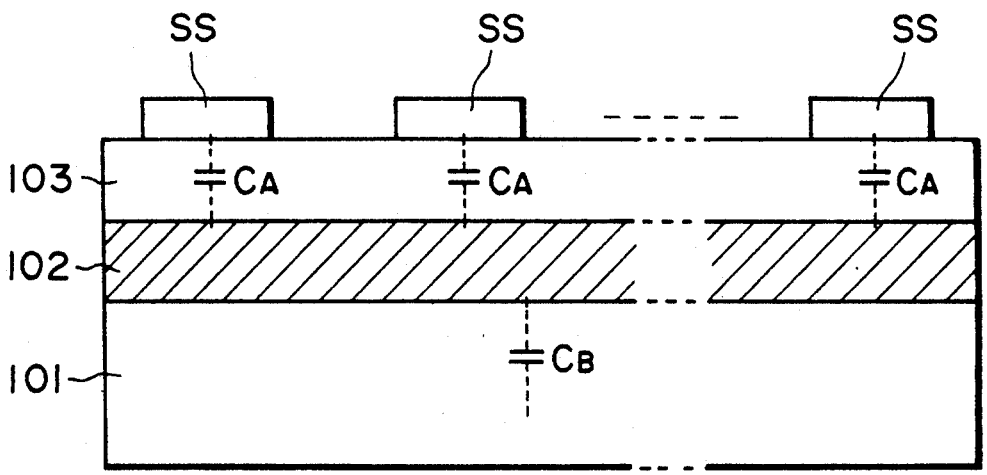
FIG. 9 is a schematic cross-sectional view showing the line sensor according to the present invention.

FIG. 9 is a schematic illustration showing the photosensor device having plurality of the above-described photosensors arranged with intervals.

Figure 10:
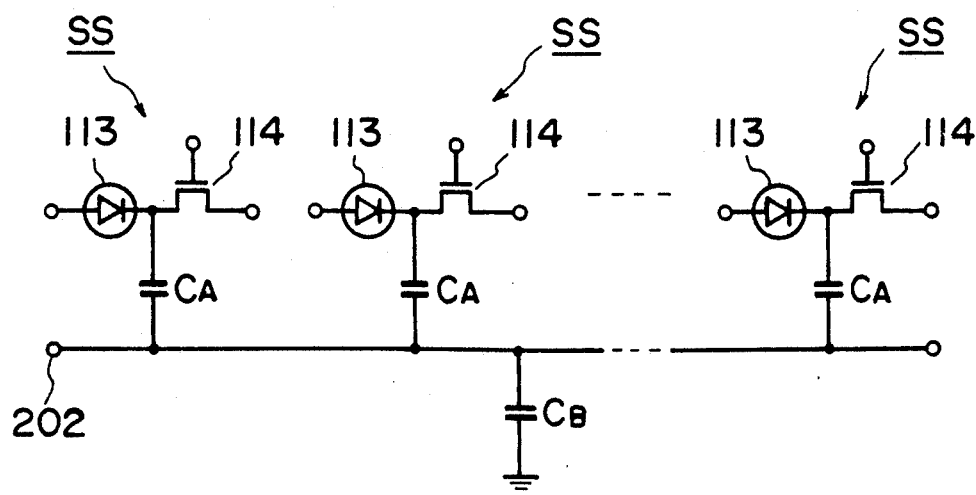
FIG. 10 is the equivalent circuit diagram of the line sensor shown in FIG. 9.
Figure 11:
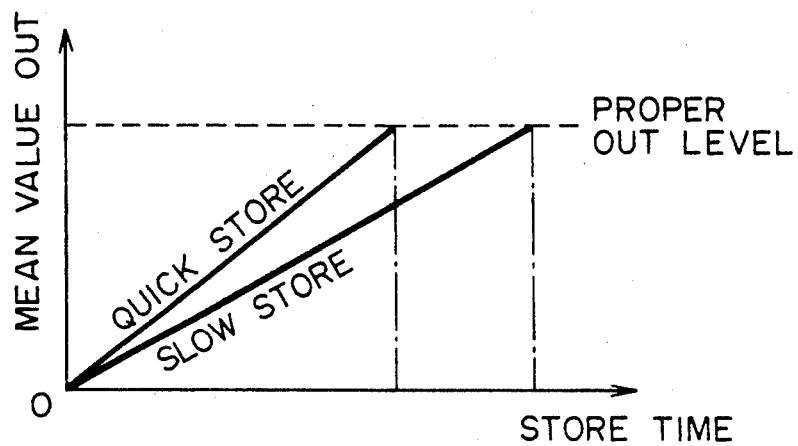
FIG. 11 is a schematic diagram illustrating the charge accumulation type photosensor.

FIG. 10 is an equivalent circuit diagram of the photosensor device shown in FIG. 9.

As can be understood from these Figures, parasitic capacitance $C_A$ is formed respectively by sandwiching the insulating layer 103 with the respective sensor cells SS and the Al layer 102 as the electroconductive layer. Also, between the Al layer 102 and the the earth, a floating capacitance $C_B$ is formed.

More specifically, to explain by referring to FIG. 10, the cathode side of the photodiode 113 of each photosensor cell is connected to the MOS transistor 114, and is connected through the parasitic capacitance $C_A$ to the Al layer 102, with the Al layer 102 being commonly grounded through the floating capacitance $C_B$.

When each photodiode 113 begins to read, the accumulated voltage Vi is transmitted through the capacitance $C_A$ without breaking to the Al layer 102. At this time, the voltage $V_A$ of the Al layer 102 which is the electroconductive layer becomes:

$$V_A = \sum_{i=1\sim n} V_i \frac{C_A}{nC_A + C_B}$$

($V_1$-$V_n$: photodiode output voltages)

Here, in the structure of this Example, since the relationship of $C_A >> C_B$ is valid, the above formula becomes:

$$V_A = \frac{\sum_{i=1\sim n} V_i}{n}$$

which shows that the $V_A$ becomes the average value in each photodiode.

Also, since the above output voltage is outputted always during accumulation actuation, it becomes possible to perform arithmetic operation of the optimum stored time during the accumulation operation.

Therefore, since the photosensor device of this Example can perform arithmetic operation following simultaneously the optimum storage time even if the accumulation ability of the photosensor may be varied, it has the specific feature that stable signals can be obtained at real time.

Figure 12:
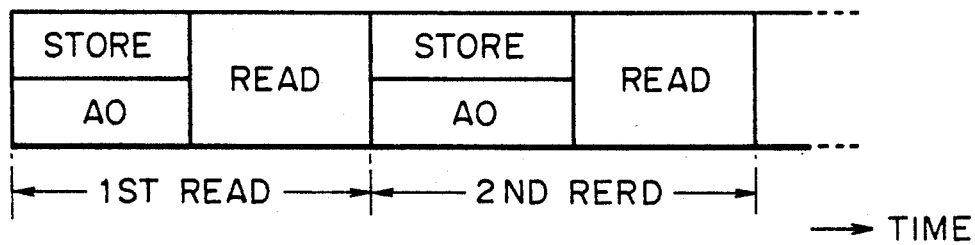
FIG. 12 is a schematic diagram illustrating the reading method and the time required for reading of the charge accumulation type photosensor according to the present invention.

As described above, the photosensor device of this Example performs an arithmetic operation of the accumulation time during accumulation actuation as shown in FIG. 12, whereby no idle read time is necessary and the read speed can be made higher. Also, no circuit for an arithmetic operation of average value is required to make the unit simpler and also lower the cost.

Thus, as described in detail in the above, according to the semiconductor device of this Example, the average value of the outputs from the charge accumulation type sensor section can be outputted without breaking and at all times. As a result, a semiconductor photosensor device capable of high speed output can be provided with a simple constitution.

SECOND EXAMPLE

Figure 13:
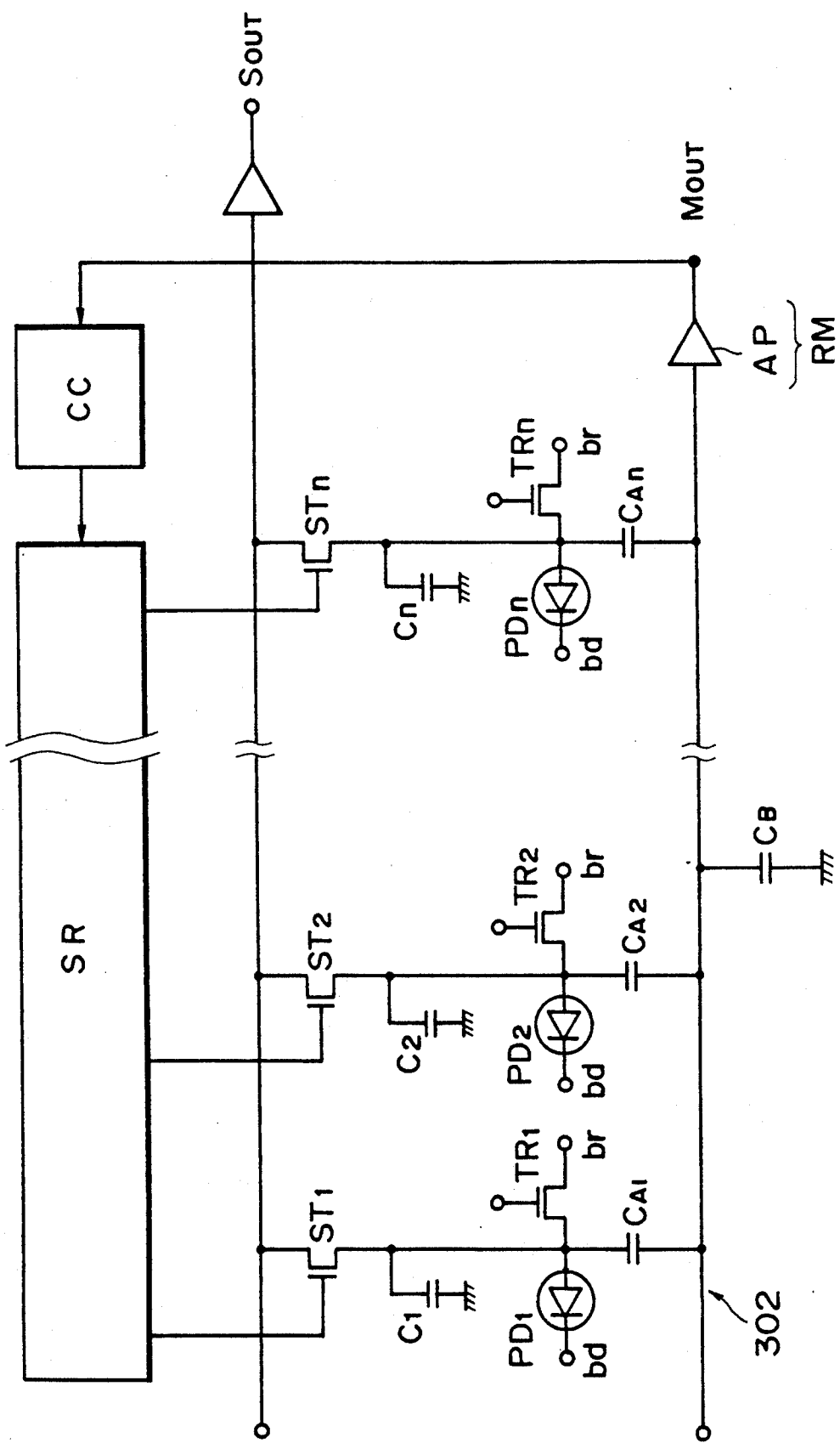
FIG. 13 is a circuit diagram of the photosensor device according to the second example of the present invention.

FIG. 13 is a circuit diagram showing the photosensor device according to the second example. $PD_1$-$PD_n$ are photodiodes as the light-receiving element, $C_1$-$C_n$ are capacitors provided corresponding to the photodiodes $PD_1$-$PD_n$ for accumulation of the charges photogenerated by said photodiodes, $ST_1$-$ST_n$ are transistors for transfer switching scanned by the shift register SR as the driving means for driving these for outputting the signal charges accumulated in the capacitors $C_1$-$C_n$ to output terminals SOUT. $TR_1$-$TR_n$ are transistors for reset switch provided for cancelling the residual charges after signal read.

The sensor cell of the combination constitution of the photodiode, the capacitor, the transistor for transfer and the transistor for reset is provided in an array, for example, having 1960 cells.

These sensor cells form capacitances $C_{A1}$-$C_{An}$ through the electroconductive layer 302 and the insulating layer.

And, the electroconductive layer 302 forms a floating capacitance $C_B$.

Next, the read method is to be described.

When each photodiode is irradiated with light, a signal voltage corresponding to the accumulated voltage is read as the signal in the read means RM including the output terminals MOUT and AP connected to the electroconductive layer.

When the voltage of the signal outputted from MOUT becomes the voltage corresponding to a desired accumulation time, the driving of the shift register is controlled by the arithmetic operation circuit CC, whereby the transistors $ST_1$ is successively turned on to output the output signal photoelectrically converted at SOUT. At this time, the respective reset transistors $TR_1$-$TR_n$ are successively turned on after respective readings are performed, whereby a residual voltage is cancelled by the bias voltage br.

Having described in the above with reference to FIG. 13, it is basically the same as shown in the first example. A bias voltage source for giving reverse bias to the phototransistor is denoted by bd.

Figure 14A:
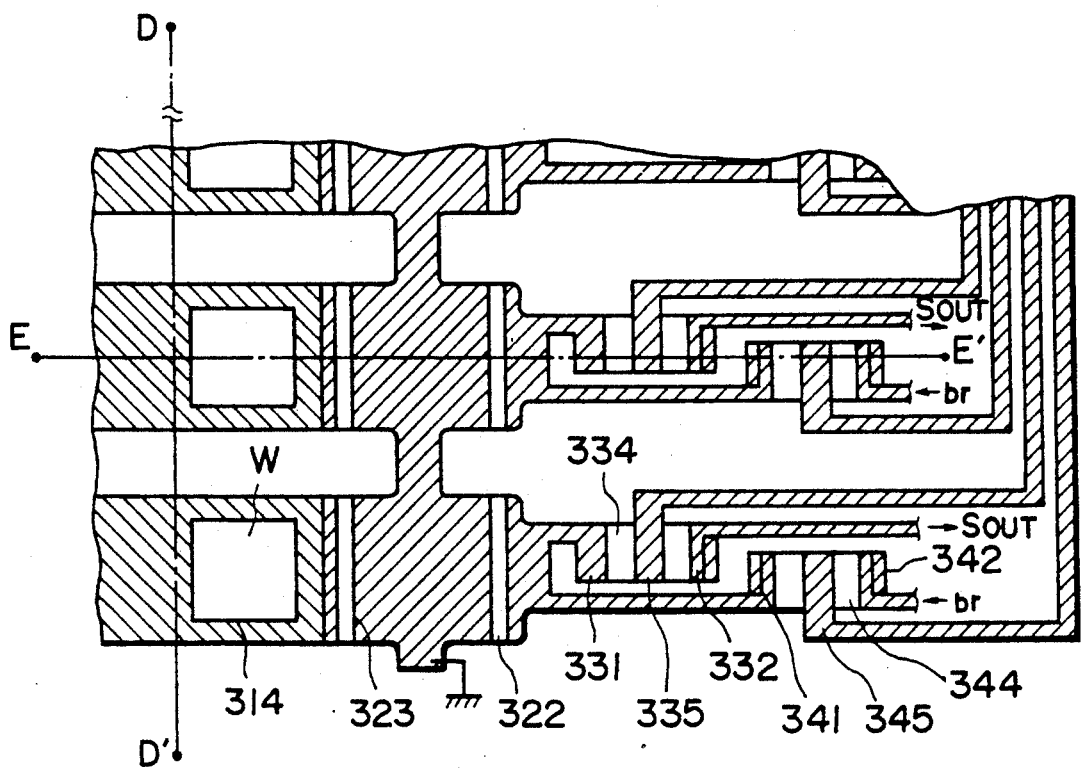
FIG. 14A is a schematic top view of the photosensor device shown in FIG. 13.

FIG. 14A is a schematic top view showing the principal part of the lengthy sensor device according to this Example.

Figure 14B:
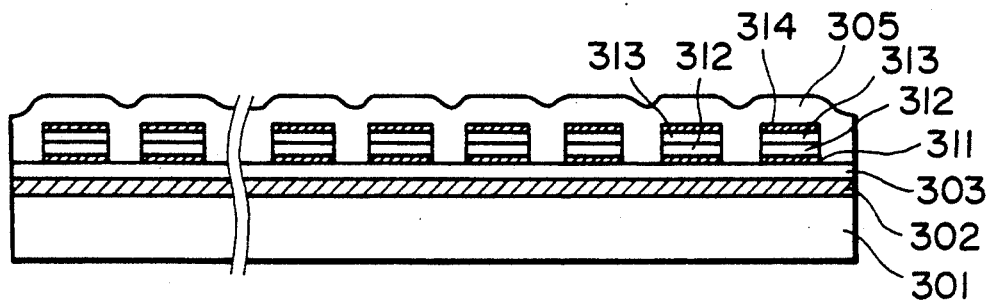
FIG. 14B is a schematic cross-sectional view taken along the line D—D' in FIG. 14A.

FIG. 14B is a schematic cross-sectional view taken along the line D—D' in FIG. 14A.

Figure 14C:
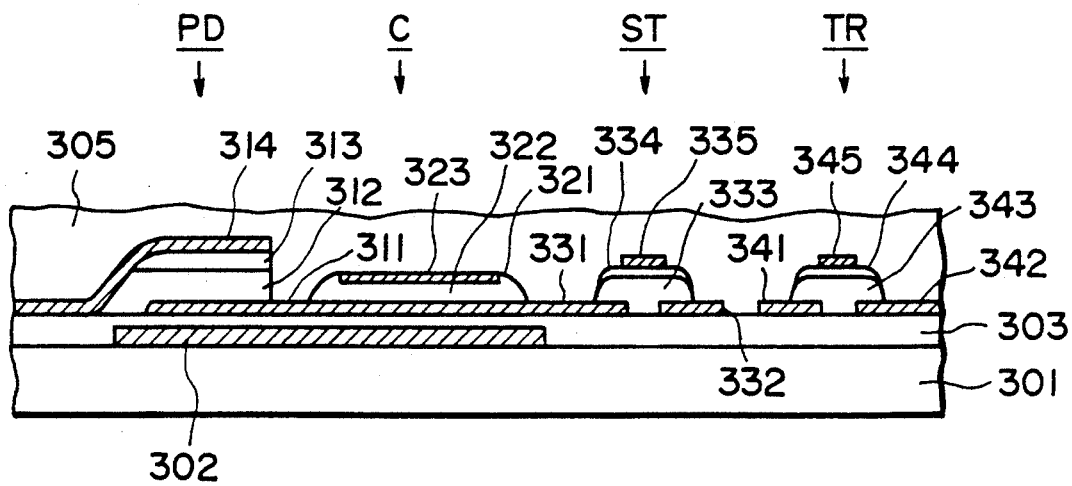
FIG. 14C is a schematic cross-sectional view taken along the line E—E' in FIG. 14A.

FIG. 14C is a schematic cross-sectional view taken along the line E—E' in FIG. 14A.

According to this Example, an electroconductive layer 302 is formed on a substrate 301. The light-receiving section PD is constituted of a lower layer electrode 311 of Al, a p-type semiconductor layer 312, an n-type semiconductor layer 313, an upper electrode 314 of Al. The information light enters the photoelectric converting regions, namely 312, 313, through the opening formed at the upper electrode 314. Here, either 312 or 313 may be upside or downside.

The charge accumulating section C comprises a lower layer electrode 321, an insulating layer 322 comprising silicon oxide and an upper electrode 323. The transistor ST for transfer has a TFT structure of n channels formed of a drain electrode 331, a source electrode 332, a channel region 333 comprising a polycrystalline silicon, an insulating layer 334 comprising silicon nitride and a gate electrode 335. Similarly, the transistor for reset TR is constituted of a drain electrode 341, a source electrode 342, a channel region 343 comprising a polycrystalline silicon, an insulating layer 344 of silicon nitride and a gate electrode 345.

These units comprising the light-receiving section, the accumulating section, the transfer section and the reset section are arranged on the same substrate in a large number with the shorter length of A4 size, and a PSG film is formed as the protective layer 305 thereon.

The electroconductive layer 302 for reading the average voltage which becomes the parameter for determining the charge accumulation time during read is formed only below the light-receiving section.

Here, the p-type semiconductor 312 comprises a polycrystalline silicon cabide (SiC) doped with boron, and the n-type semiconductor layer 313 comprises a polycrystalline silicon cabide (SiC) doped with phosphorus.

Figure 15:
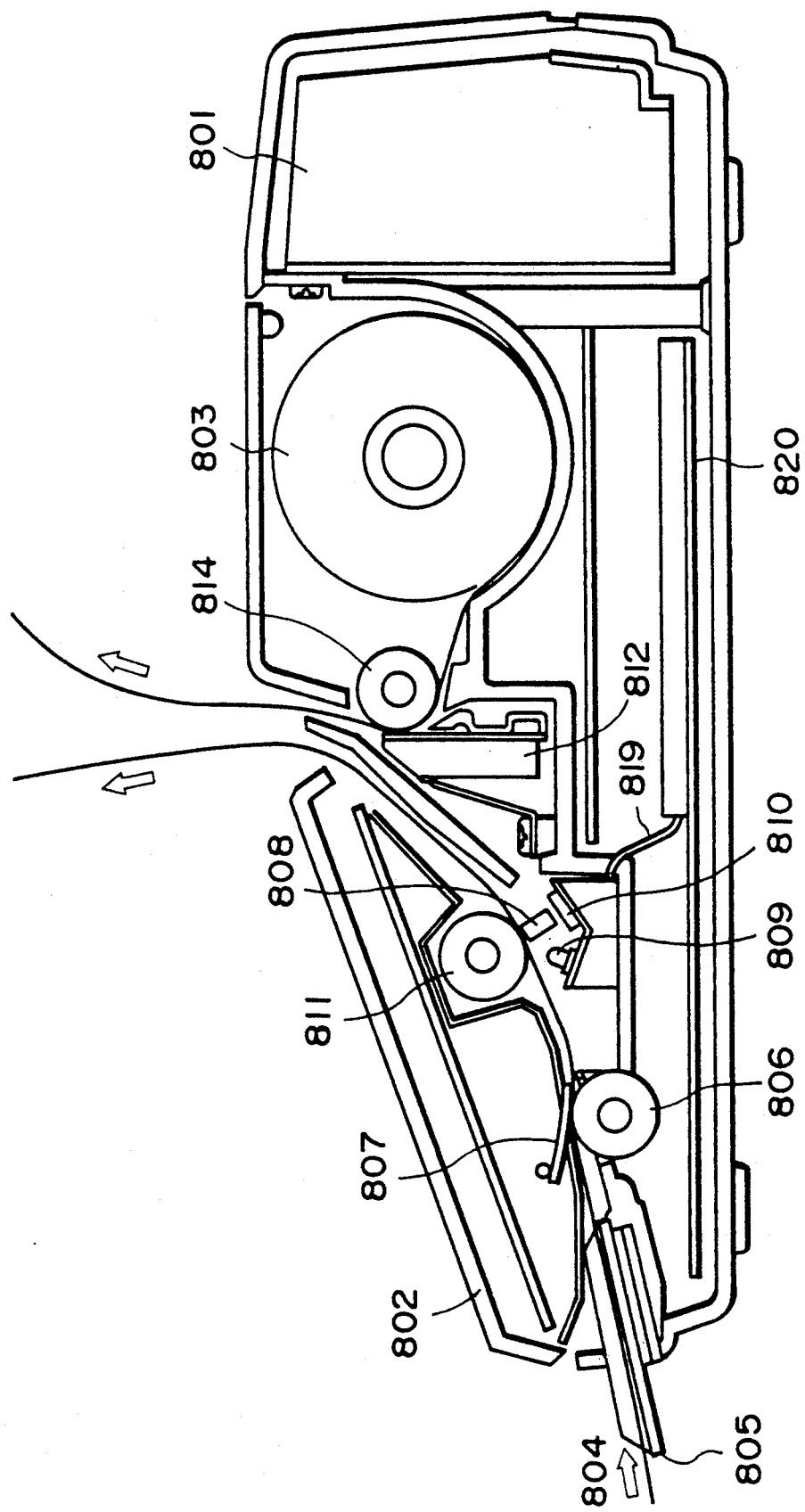
FIG. 15 is a schematic diagram showing an example of the signal processing device according to the present invention.

FIG. 15 shows an example of the signal processing device according to the present invention, and is specifically a schematic cross-sectional view showing a facsimile as an example of the signal processing device having the photosensor device shown in FIGS. 13 and 14 mounted thereon.

Element 801 is a power source for driving of facsimile 802 an operation panel and element 803 a recording paper for recording received images.

An original 804 is inserted through an original inserting opening 805 to a feeding roller 806 with the image information surface being face down. At this time, on detection of the original by an original detection sensor not shown, the feeding roller 806 begins to be rotated in the clockwise direction. The feeding roller 806 and the separating blade 807 are pressure contacted, and when plural sheets of original come, they are sent downstream as separated one by one.

The photosensor device 810 is arranged so as to read the image through the equal size type lens array 808 by irradiation of the original from a light source 809.

And, when the tip end of the original is sandwiched between the both of the lens array 808 and the platen roller 811, the image information is read while delivering the original by the platen roller 811. Element 812 is a thermal head for reproducing the received image onto a heat-sensitive recording paper 803, and 814 is a platen roller for recording.

Element 820 is a system control substrate, which is connected through a wiring 819 to the photosensor device 810, and includes a circuit for driving the shift register by performing arithmetic operation of the output value read through the electroconductive layer 302 as shown in FIG. 13 to determine the accumulation time.

Of course, such circuit may be one provided on an integrated photosensor device unit including the light source and the lens array 808.

As described above, according to the present invention, the idle time required in the prior art can be obviated to enable high speed reading.

We claim:

1. A semiconductor device comprising:
   a plurality of charge accumulation type sensor elements each of said sensor elements having an active semiconductor region;
   a plurality of charge transferring elements for transferring charge signals stored in said sensor elements, each of said charge transferring elements corresponding to a respective one of said sensor elements;
   a common conductive member provided with an insulating member being capacitively coupled with said sensor elements; and
   operating means for producing a drive signal to drive said charge transferring elements and for detecting the voltage signal on said common conductive member,
   wherein said charge transferring elements are controlled on the basis of the drive signal produced in accordance with the voltage on said common conductive member.

2. A semiconductor device according to claim 1, wherein each of said charge transferring elements comprises a switch element section.

3. A semiconductor device according to claim 1, further comprising plural switch elements, wherein each of said charge accumulation type sensor elements electrically connects with a corresponding one of said switch elements for resetting a potential of said photoelectric converting section.

4. A semiconductor device according to claim 1, wherein each of said charge accumulation type sensor elements comprises a photovoltaic element section.

5. A semiconductor device according to claim 4, wherein said photovoltaic section comprises a diode.

6. A semiconductor device according to claim 1, wherein each of said charge accumulation type sensor elements comprises a photoconductive element section and a charge accumulation section.

7. A semiconductor device according to claim 1, wherein said insulating member comprises a material selected from the group consisting of silicon oxide, silicon nitride and silicon oxide nitride.

8. A semiconductor device according to claim 1, wherein said insulating member comprises a material selected from the group consisting of PSG and BSG.

9. A semiconductor device according to claim 1, wherein said electroconductive member comprises a material selected from the group consisting of Al, Cr, Ni, Cu, Au, Ag, Pt and W.

10. A semiconductor device according to claim 1, wherein said electroconductive member comprises a material selected from the group consisting of $SnO_2$ and ITO.

11. A semiconductor device according to claim 1, wherein said charge accumulation type sensor device has an active region comprising a semiconductor material selected from the group consisting of Si, Ge and Se.

12. A semiconductor device according to claim 1, wherein said charge accumulation type sensor device has an active region comprising a semiconductor material selected from the group consisting of SiC and SiGe.

13. A semiconductor device according to claim 1, wherein said charge accumulation type sensor device has an active region comprising a semiconductor material comprising GaAs.

14. A semiconductor device according to claim 1, wherein said charge accumulation type sensor device has an active region comprising a non-crystalline semiconductor material selected from the group consisting of Si, Ge, and Se.

15. A semiconductor device according to claim 1, wherein said charge accumulation type sensor device has an active region comprising a non-single crystalline semiconductor material selected from the group consisting of SiC and SiGe.

16. A semiconductor device according to claim 1, wherein said charge accumulation type sensor device has an active region comprising a non-single crystalline semiconductor material selected from the group consisting of SiC and SiGe.

17. A semiconductor device according to claim 1, wherein said charge accumulation type sensor element has an active region comprising an ultra-lattice structure.

18. A semiconductor device according to claim 1, wherein said semiconductor device comprises a line sensor device.

19. A semiconductor device according to claim 1, wherein said semiconductor device comprises an area sensor device.

20. A signal processing device comprising:
a semiconductor device comprising,
   a plurality of charge accumulation type sensor elements each of said sensor elements having an active semiconductor region, and
   a common conductive member provided with an insulating member being capacitively coupled with said sensor elements; and
signal readout means comprising,
   a plurality of charge transferring elements for transferring charge signals stored in said sensor elements, and
   driving means for driving said charge transferring elements in accordance with a voltage signal of said common conductive member.

21. A signal processing device according to claim 20, wherein said signal processing device comprises a scanner device for reading of an image.

22. A signal processing device according to claim 20, wherein said signal processing device comprises a facsimile device.

23. A signal processing device according to claim 20, wherein said signal processing device comprises a camera.

* * * * *

UNITED STATES PATENT AND TRADEMARK OFFICE
CERTIFICATE OF CORRECTION

PATENT NO. : 5,040,041
DATED : August 13, 1991
INVENTOR(S) : KATSUHIKO YAMADA, ET AL.

Page 1 of 2

It is certified that error appears in the above-identified patent and that said Letters Patent is hereby corrected as shown below:

Title page:

IN [30] FOREIGN APPLICATION PRIORITY DATA

Insert: --Oct. 13, 1989 [JP] Japan ...... 1-265117--.

IN [56] REFERENCES CITED

U.S. PATENT DOCUMENTS, "Fukada et al." should read --Fukuda et al.-- and "Hatanka et al." should read --Hatanaka et al.--.

SHEET 6 OF 9

FIG. 12, "RERD" should read --READ--.

COLUMN 1

Line 34, "feedback" should read --fed back--.

COLUMN 2

Line 63, "includes" should be deleted.

COLUMN 3

Line 26, "of" should read --from--.
Line 56, "These" should read --This--.

COLUMN 5

Line 21, "on" should read --an--.
Line 37, "B2H6" should read --$B_2H_6$--.

UNITED STATES PATENT AND TRADEMARK OFFICE
CERTIFICATE OF CORRECTION

PATENT NO. : 5,040,041
DATED : August 13, 1991
INVENTOR(S) : KATSUHIKO YAMADA, ET AL.

Page 2 of 2

It is certified that error appears in the above-identified patent and that said Letters Patent is hereby corrected as shown below:

COLUMN 6

Line 23, "As the" should read --The-- and "section," should read --section--.
Line 27, "As the" should read --The-- and "section," should read --section--.

COLUMN 9

Line 14, "cabide" should read --carbide--.
Line 16, "cabide" should read --carbide--.

Signed and Sealed this

Fifteenth Day of June, 1993

Attest:

MICHAEL K. KIRK

Attesting Officer

Acting Commissioner of Patents and Trademarks